(12) United States Patent
Moffat et al.

(10) Patent No.: US 10,109,537 B2
(45) Date of Patent: Oct. 23, 2018

(54) ELECTRICALLY TESTABLE MICROWAVE INTEGRATED CIRCUIT PACKAGING

(71) Applicant: pSemi Corporation, San Digeo, CA (US)

(72) Inventors: Mark Moffat, Berkshire (GB); Andrew Christie, Berkshire (GB); Duncan Pilgrim, Encinitas, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/799,870

(22) Filed: Oct. 31, 2017

(65) Prior Publication Data

US 2018/0211890 A1    Jul. 26, 2018

Related U.S. Application Data

(62) Division of application No. 14/741,303, filed on Jun. 16, 2015, now Pat. No. 9,837,325.

(51) Int. Cl.
*H01L 23/00* (2006.01)
*H01L 21/66* (2006.01)
(Continued)

(52) U.S. Cl.
CPC .............. *H01L 22/14* (2013.01); *H01L 22/32* (2013.01); *H01L 24/97* (2013.01); *H01L 23/15* (2013.01); *H01L 23/3121* (2013.01); *H01L 23/66* (2013.01); *H01L 24/13* (2013.01); *H01L 24/16* (2013.01); *H01L 24/48* (2013.01); *H01L 2223/6627* (2013.01); *H01L 2224/131* (2013.01); *H01L 2224/16227* (2013.01);
(Continued)

(58) Field of Classification Search
CPC .......... H01L 22/14; H01L 22/32; H01L 22/34
See application file for complete search history.

(56) References Cited

U.S. PATENT DOCUMENTS 9,837,325 B2    12/2017 Moffat et al.
2002/0109223 A1*  8/2002 Katoh ..................... H01L 23/66
                                                              257/728

(Continued)

OTHER PUBLICATIONS

Tran, Trang Q., Office Action received from the USPTO dated Jun. 17, 2016 for U.S. Appl. No. 14/741,303, 8 pgs.

(Continued)

*Primary Examiner* — Cuong Q Nguyen
(74) *Attorney, Agent, or Firm* — Jaquez Land Greenhaus LLP; Martin J. Jaquez, Esq.; John Land, Esq.

(57) ABSTRACT

An extension of conventional IC fabrication processes to include some of the concepts of flip-chip assemblies while producing a final "non-flip chip" circuit structure suitable for conventional packaging or for direct usage by customers. Multiple IC dies are fabricated on a semiconductor wafer in a conventional fashion, solder bumped, and singulated. The singulated dies are then flip-chip assembled onto a single tile substrate of thin-film material which has been patterned with vias, peripheral connection pads, and one or more ground planes. Once dies are flip-chip mounted to the thin-film tile, all of the dies on the entire tile may be probed using automated testing equipment. Once test probing is complete, the dies and tile are singulated into die/tile assemblies.

41 Claims, 4 Drawing Sheets

(51) Int. Cl.
  *H01L 23/15* (2006.01)
  *H01L 23/31* (2006.01)
  *H01L 23/66* (2006.01)

(52) U.S. Cl.
  CPC ............... *H01L 2224/16235* (2013.01); *H01L 2224/48227* (2013.01); *H01L 2224/94* (2013.01); *H01L 2224/97* (2013.01); *H01L 2924/00014* (2013.01); *H01L 2924/10253* (2013.01); *H01L 2924/14* (2013.01); *H01L 2924/1421* (2013.01); *H01L 2924/15159* (2013.01); *H01L 2924/15162* (2013.01); *H01L 2924/15192* (2013.01); *H01L 2924/15787* (2013.01); *H01L 2924/16251* (2013.01)

(56) References Cited

U.S. PATENT DOCUMENTS

| | | |
|---|---|---|
| 2005/0285234 A1 | 12/2005 | Kanno |
| 2011/0208467 A1* | 8/2011 | Tang .................... G01R 35/007 702/117 |
| 2016/0372387 A1 | 12/2016 | Moffat et al. |

OTHER PUBLICATIONS

Nguyen, Cuong Quang, Office Action received from the USPTO dated Nov. 3, 2016 for U.S. Appl. No. 14/741,303, 16 pgs.

Nguyen., Cuong Quang, Final Office Action received from the USPTO dated May 5, 2017 for U.S. Appl. No. 14/741,303, 16 pgs.

Nguyen., Cuong Quang, Advisory Action received from the USPTO dated Aug. 11, 2017 for U.S. Appl. No. 14/741,303, 4 pgs.

Nguyen., Cuong Quang, Notice of Allowance received from the USPTO dated Sep. 26, 2017 for U.S. Appl. No. 14/741,303, 5 pgs.

Moffat, et al., Response filed in the USPTO dated Jul. 1, 2016 for U.S. Appl. No. 14/741,303, 9 pgs.

Moffat, et al., Response filed in the USPTO dated Dec. 1, 2017 for U.S. Appl. No. 14/741,303, 11 pgs.

Moffat, et al., Response filed in the USPTO dated Jul. 25, 2017 for U.S. Appl. No. 14/741,303, 11 pgs.

* cited by examiner

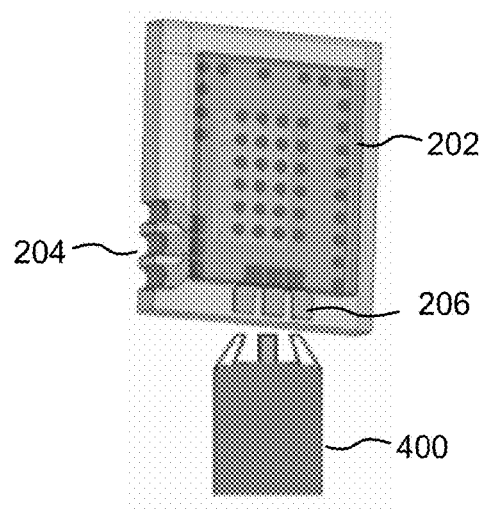
FIG. 4
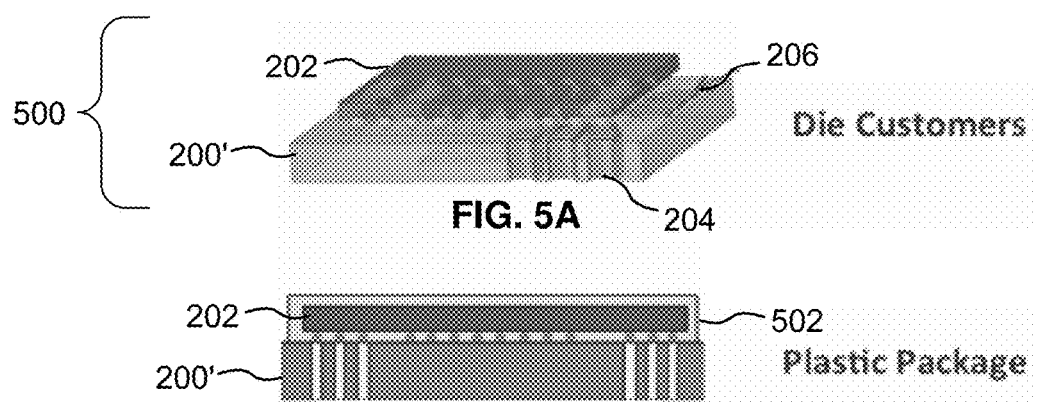
FIG. 5A
FIG. 5B
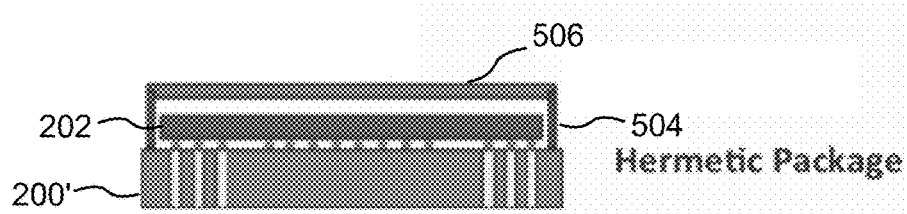
FIG. 5C

ELECTRICALLY TESTABLE MICROWAVE INTEGRATED CIRCUIT PACKAGING

CROSS REFERENCE TO RELATED APPLICATION—CLAIM OF PRIORITY

This application is a divisional of, and claims the benefit of priority under 35 USC § 120 or 35 USC § 121 of, commonly assigned and prior U.S. application Ser. No. 14/741,303, filed Jun. 16, 2015, "Electrically Testable Microwave Integrated Circuit Packaging" which is herein incorporated by reference in its entirety.

BACKGROUND

(1) Technical Field

This invention involves integrated circuit packaging structures and methods for microwave integrated circuits, and related integrated circuit testing methods.

(2) Background

In typical semiconductor fabrication systems, integrated circuits (IC) dies (also known as "chips") are built up in large numbers on a single large wafer of semiconductor material, and then eventually cut out of the wafer ("singulated") as individual dies. Such ICs are generally either sold in bare die form or in packaged form (e.g., plastic packages). However, handling a conventional IC part in bare-die form is difficult for a typical customer, because clean room facilities are required to assemble the die into a chip-and-wire hybrid assembly and specialist pick-and-place machines are required for "bumped" die. Accordingly, many customers would prefer receiving packaged microwave ICs from vendors. One drawback of using packaged ICs is that the package degrades the microwave performance of the part due to unwanted (parasitic) electrical effects such as bond-wire inductance.

An important aspect of packaging and testing conventional microwave ICs is limiting the effects of external influences and uncompensated parasitic influences (e.g., parasitic inductances and capacitances) on the designed microwave circuitry embodied on an IC die. One way to do so is to provide ample ground connections to sensitive circuit elements and limit the electrical length of such connections.

Most microwave ICs on the market today are fabricated on substrates made from rather exotic compounds from the III-V group of semiconductors (e.g., gallium arsenide), which allow the fabrication of through-hole vias (i.e., holes piercing select areas of an IC die) to achieve low inductance ground connections on one surface of a die to selected locations on the other surface of the die. Such vias connect directly to the back surface of a III-V material IC die, and the back surface is electrically connectable directly to a circuit ground plane. The presence of through-hole vias and backside grounding allows a conventional microwave IC die to be tested using automated wafer-probe technology. After testing, validated dies are generally packaged for use by customers, with the attendant drawbacks noted above.

Disadvantages in using III-V materials for IC dies include toxicity of the materials and greater cost relative to IC dies made on silicon or on silicon-on-insulator (SOI) substrates (including but not limited to silicon-on-sapphire, or "SOS", substrates). However, typical silicon or SOI IC dies do not have the capability to form through-hole vias. Such ICs therefore rely on wire-bonds at the outer edge of a die or "flip-chip" packaging to provide grounding.

With wire bonding, a die is mounted upright in a carrier package or on a circuit board or another chip or wafer, and wires are used to electrically and mechanically couple connection pads on the edges of a die to external connector pins or circuitry. Wire-bonding is deficient at high radio frequencies (e.g., greater than about 8 GHz) because the wire-bonds have significant length and therefore inductance, which limits grounding effectiveness. Further, ground connections are limited to edges of a die; accordingly, circuit elements located away from the die edges may not be adequately grounded and/or parasitic circuit influences may be created by running conductive traces from the IC pads to the interior of the die. Such grounding problems with wire-bonded silicon or SOI dies means that automated wafer probing cannot be easily implemented, resulting in problems of verifying performance at microwave frequencies. Further, in packaged form, the parasitics of the package cause degradation of microwave performance, through bond-wire inductance in both signal and ground connections, and imperfect signal routing from a bond-wire to the exterior of the package. Moreover, testing of a packaged device generally requires a socket or fixture that leads to uncertainty and unreliability of the test results, since the test socket or fixture is not part of the final product shipped to a customer and generally adds parasitic factors to the circuit under test.

To overcome the grounding and testing issues with wire bonding, "flip-chip" packaging and processing may be used for some applications. "Flip chip" processing (also known as controlled collapse chip connection or its acronym, C4) is a method for interconnecting IC dies to external circuitry. FIG. 1A shows a single integrated circuit die 100 having a grid of metalized connection pads 102 on the top surface; multiple dies would be simultaneously formed on a silicon or SOI wafer. FIG. 1B shows the IC die 100 of FIG. 1A with solder bumps 104 deposited onto the grid of connection pads 102. The solder bumps are usually deposited on the pads on the top side of each die of a wafer during the final wafer processing step. In order to mount a die to an external circuit structure (e.g., a circuit board or another chip or wafer), the wafer is singulated into dies, then each die is flipped over so that its top side faces down and aligned so that its pads align with matching pads on the external circuit structure. FIG. 1C shows the IC die 100 of FIG. 1B flipped and positioned so that the solder bumps 104 are facing a matching set of connectors 106 of an external circuit structure 108. FIG. 1D shows that the solder bumps 104 of the IC die 100 of FIG. 1C are then re-melted (typically using hot air reflow) to complete the interconnection. The mounted die may then be under-filled using an electrically-insulating adhesive to provide a stronger mechanical connection, provide a heat bridge, and to ensure the solder joints are not stressed due to differential heating of the chip and the rest of the system.

The resulting completed flip chip assembly is much smaller than a traditional carrier-based system; the chip can sit directly on a circuit board, and is much smaller than a carrier package in both area and height. The many short solder bump connections greatly reduce inductance, allowing higher-speed signals, and also conduct heat better. Further, automated wafer-probe technology can be used to test a flip chip while the connection pads are exposed.

However, flip chip processing has several disadvantages. Customer manufacturing processes may not be compatible with flip chip assembly, which requires special handling equipment to pick and position the singulated dies, as well as to perform the reflow process. Accordingly, flip chip microwave ICs fabricated on silicon or SOI wafers are not suitable for many customers.

The limitations of both wire-bonded packaging and flip chip assemblies are a primary hindrance to the use of silicon-based IC technology at microwave frequencies. The present invention addresses this problem.

SUMMARY OF THE INVENTION

The present invention extends conventional IC fabrication processes to include some of the concepts of flip-chip assemblies while producing a final "non-flip chip" circuit structure suitable for conventional packaging or for direct usage by customers.

In one embodiment, multiple IC dies are fabricated on a semiconductor wafer (e.g., silicon or SOI) in a conventional fashion. The dies on the wafer are then solder bumped using commercially available processes, and singulated. Solder bumping allows ground connections to be placed anywhere on the surface of a die and can therefore be close to the circuits that require them, similar to the availability of through-hole vias in III-V semiconductor-based ICs.

In an important step, the singulated dies are then flip-chip assembled onto a single tile substrate of thin-film material, such as alumina or low temperature co-fired ceramic (LTCC), etc., which has been patterned with vias, peripheral connection pads, and one or more ground planes.

Once dies are flip-chip mounted to the thin-film tile, all of the dies on the entire tile may be tested using automated testing equipment by directly probing the tile and connecting to the die via the tile interconnects. Once test probing is complete, the dies and tile are singulated into die/tile assemblies. There are a number of options available for the final package application of the die/tile assemblies.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 4 shows a single die mounted on a portion of a thin film tile and positioned such that a GSG test probe can engage probe-compatible connection pads.

FIG. 5A shows a complete die/tile assembly comprising a flip-chipped die and a singulated segment of the thin-film tile.

FIG. 5B shows a complete die/tile assembly in an overmolded plastic package, formed in conventional fashion to encapsulate and seal the die.

FIG. 5C shows a complete die/tile assembly in a hermitically sealed package.

Like reference numbers and designations in the various drawings indicate like elements.

DETAILED DESCRIPTION OF THE INVENTION

The present invention extends conventional IC fabrication processes to include some of the concepts of flip-chip assemblies while producing a final "non-flip chip" circuit structure suitable for conventional packaging or for direct usage by customers.

In one embodiment, multiple IC dies are fabricated on a semiconductor wafer (e.g., silicon or SOI, including but not limited to silicon-on-sapphire) in a conventional fashion. The dies on the wafer are then solder bumped using commercially available processes, and singulated. Solder bumping allows ground connections to be placed anywhere on the surface of a die and can therefore be close to the circuits that require them, similar to the availability of through-hole vias in III-V semiconductor-based ICs.

In an important step, the singulated dies are then flip-chip assembled onto a single tile substrate of thin-film material, such as alumina or low temperature co-fired ceramic (LTCC), etc., which has been patterned with vias, peripheral connection pads, and one or more ground planes.

Figure 1A:
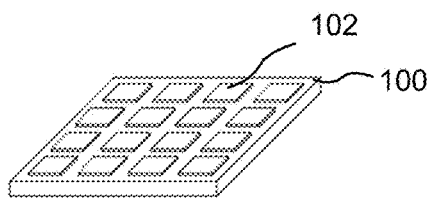
FIG. 1A shows a single integrated circuit die having a grid of metalized connection pads on the top surface.
Figure 1C:
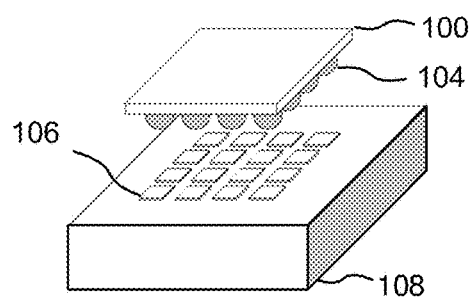
FIG. 1C shows the IC die of FIG. 1B flipped and positioned so that the solder bumps are facing a matching set of connectors of an external circuit structure.
Figure 1B:
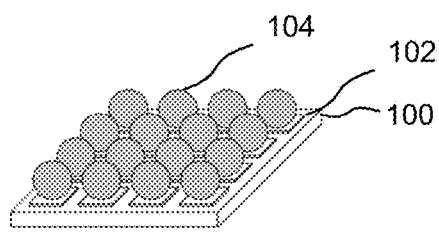
FIG. 1B shows the IC die of FIG. 1A with solder bumps deposited onto the grid of connection pads.
Figure 1D:
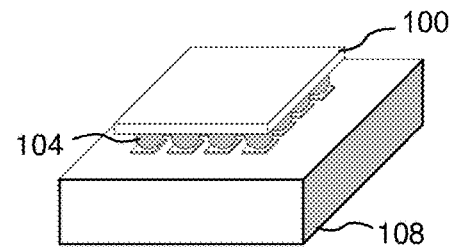
FIG. 1D shows that the solder bumps of the IC die of FIG. 1C are then re-melted to complete the interconnection.
Figure 2A:
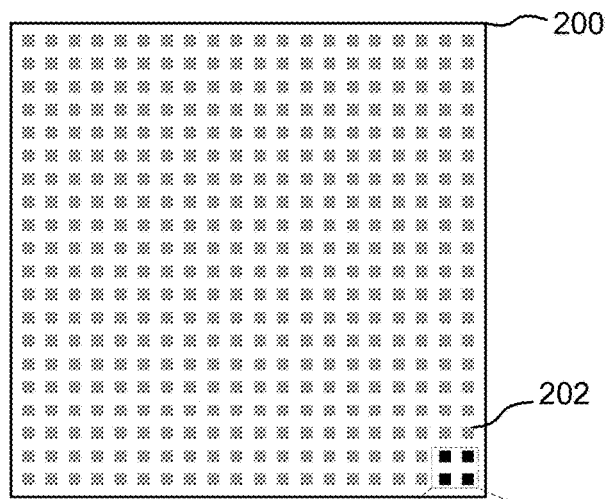
FIG. 2A is a diagram of a thin-film tile on which multiple singulated dies have been flip-chip assembled.
Figure 2B:
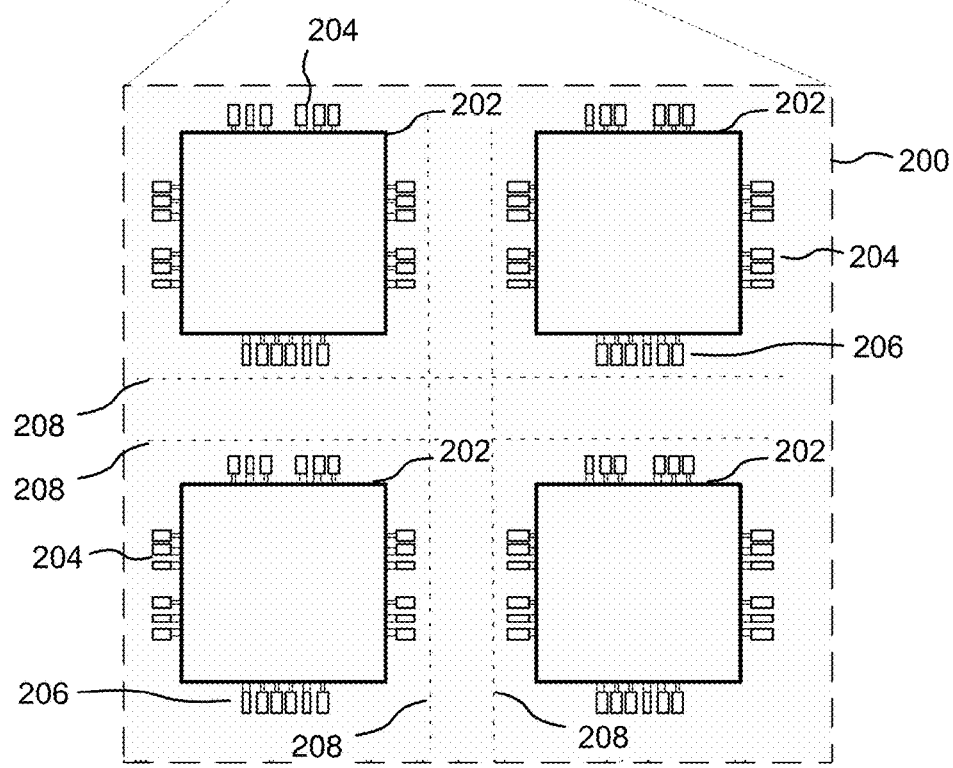
FIG. 2B is an enlarged diagram of a section of FIG. 2A, showing several singulated dies that have been flip-chip assembled.

FIG. 2A is a diagram of a thin-film tile 200 on which multiple singulated dies 202 have been flip-chip assembled (400 die are shown in the illustrated embodiment). FIG. 2B is an enlarged diagram of a section of FIG. 2A, showing several singulated dies 202 that have been flip-chip assembled (the tile 200 has not yet been singulated). In the illustrated embodiment, the tile 200 is about 4 inches on a side, and each die is about 2×2 mm (of course, other tile and die sizes may be used).

An important characteristic of the tile 200 material is that it be as thin as possible while retaining sufficient rigidity for structural integrity and manual and automated handling. Since through-hole vias pass from the top side of the tile to the bottom side, a thin tile 200 allows a short, low-inductance ground connection from the ground bumps of the die to a circuit ground plane on the back of the tile 200. The low inductance ground connection results in low impedance at RF frequencies. Particularly good results have been found with thin-film tiles having an approximate thickness of ≤0.35 mm, ≤0.23 mm, and ≤0.175 mm (in contrast, a conventional printed circuit board typically has a thickness of 1.0-1.5 mm). The tiles 200 may be a single layer or may be a multi-layer structure. In the case of a multi-layer structure, embodiments may use blind vias (from an outer surface to a buried conductive layer) and/or buried vias (from one buried conductive layer to another buried conductive layer). Suitable tile substrates are available from Murata Manufacturing Co., Ltd and other manufacturers.

Referring again to FIG. 2B, visible are probe-compatible connection pads 204, 206 arrayed around the periphery of each die 202. These probe-compatible connection pads 204, 206 are used to automatically wafer-probe the tile 200 of dies 202 on a conventional automatic wafer-probing system. In the embodiment shown in FIG. 2B, two sets of three ground-signal-ground (GSG) probe-compatible connection pads 204 are arranged on each of the north (top of figure page), east, and west sides of the die 200. The south side of the die 20 includes six DC/control signal probe-compatible connection pads 206. In the illustrated embodiment, the GSG pads 204 are on a standard 150 μm pitch for compatibility with conventional wafer-scale probes and testing equipment. More or fewer sets of GSG pads 204 and/or DC/control signal pads 206 may be used depending on the nature of the circuitry on the die 202, and the spacing and function of the pads 204, 206 may be varied by application. The dotted lines 208 visible in FIG. 2B are the eventual singulation lines used to divide the tile 200 into individual components. Singulation does not occur until after probing to allow automatic stepping of a measurement probe.

Figure 3A:
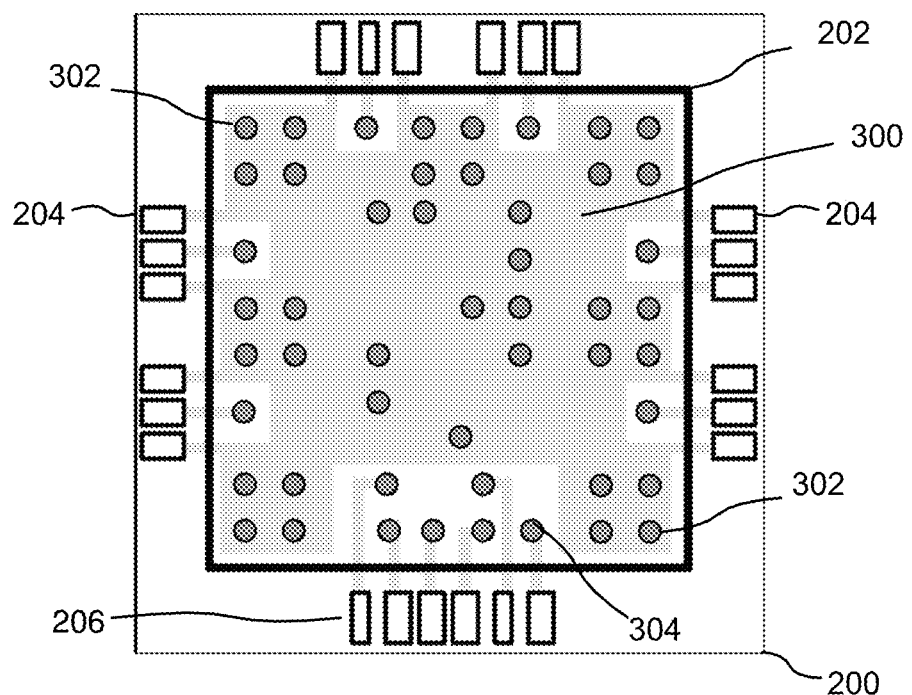
FIG. 3A is a top view, in partial transparency, of one die on a corresponding section of thin-film tile.

FIG. 3A is a top view, in partial transparency, of one die 202 on a corresponding section of thin-film tile 200 (again, the tile 200 has not yet been singulated at this point). In this particular view, the interior contiguous gray area is a ground plane 300 formed on the top surface of the tile 200. One or more solder bumps 302 are configured to connect appropriate circuit elements on the top (i.e., the circuit surface) of the flipped die 202 to the ground plane 300 of the tile 200. In turn, the ground plane 300 is generally connected by through-hole vias to a ground plane (not shown) on the bottom surface of the tile 200 which serves as an interfacing ground with a testing system and/or printed circuit board. Typically, the grounds of the GSG probe-compatible connection pads 204 are connected to the backside ground.

In addition, circuit signals are connected from pad-connection solder bumps 304 near the periphery of the die 202 to co-located probe-compatible connection pads 204, 206 on the top side of the tile 200, preferably through impedance-controlled connections (e.g., stripline, microstrip, or coplanar waveguides).

Figure 3B:
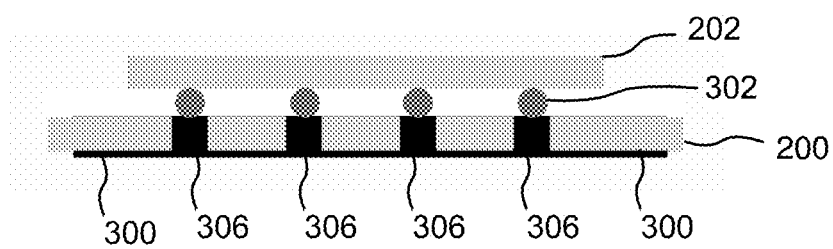
FIG. 3B is a cross-sectional side view of one die on a corresponding section of the tile.

In alternative embodiments, the ground plane 300 can be formed only on the back surface of the tile 200, and connected by through-hole vias to one or more solder bumps 302 and thus to appropriate circuit elements of the die 202. FIG. 3B is a cross-sectional side view of one die 202 on a corresponding section of the tile 200 (again, the tile 200 has not yet been singulated at this point). In the illustrated embodiment, four solder bumps 302 are shown coupling the circuit surface of a die 202 through corresponding through-hole vias 306 to a ground plane 300 on the back side of the tile 200. Not shown are other solder bumps 302 connecting the circuit surface of the die 202 to the top side of the tile 200, such as to probe-compatible connection pads 204, 206. One benefit of a back side ground plane 300 is that more of the top side of a tile 200 is available to couple probe-compatible connection pads 204, 206 to interior circuit elements of a die 202.

In yet other embodiments, one portion of the ground plane 300 may be on the top side of a tile 200, and another portion of the ground plane 300 may be on the bottom side of the tile 200, electrically coupled by one or more through-hole vias 306. In still other embodiments, all or part of a ground plane 300 may be a buried layer within a multi-layer thin-film tile 200, connected to a die 202 by some combination of blind vias, buried vias, solder bumps, and conductive leads. In some embodiments, additional elements may be placed on the thin-film tile 200; for example, calibration structures for wafer probing equipment can be configured on the top and/or bottom of a tile 200.

An additional use of through-hole vias is to couple probe-compatible connection pads 204, 206 on the top side of a tile 200 to connection traces on the bottom side of the tile 200, or to position the probe-compatible connection pads 204, 206 on the bottom side of the tile 200 and couple them to connection traces on the top side of the tile 200, or any combination of such configurations. Probing thus can occur on the bottom side of a tile 200 using the actual signal pads that later will be soldered to the customer's printed circuit board. Such probing may be done with GSG style probes or with Pyramid Probes®, which are a form of a user-defined impedance-controlled probes available from Cascade Microtech, Inc. of Beaverton, Oreg.

Adequate grounding connections are critical for high frequency RF testing. Such connections have to be kept as short and as numerous as possible to minimize ground inductance. Notably, by using a combination of solder bumps 302 on a flipped die 202, vias (of various kinds), and various top-and-bottom ground plane 300 configurations, any part of the periphery and interior of the circuit surface of the die 202 can be coupled to circuit ground. Additionally, the same combination of design elements allows fabrication of impedance-controlled connections from probe-compatible connection pads 204, 206 to test points on the flipped die 202. Further, impedance-controlled connections can be made from top-side probe-compatible connection pads 204, 206 through the thin-film tile 200 to accessible pads on the bottom of the tile 200, in order to allow bottom-side access to the signal ports using surface mount methodologies.

Once dies 202 are flip-chip mounted to a suitably configured thin-film tile 200, all of the dies 202 on the entire tile 200 may be probed using automated testing equipment. For example, FIG. 4 is a depiction of a single die 202 (again, pre-singulation) mounted on a portion of a thin-film tile 200 and positioned such that a GSG test probe 400 can engage probe-compatible connection pads 204, 206. The dies 202 must be placed sufficiently far apart on a tile 200 to provide clearance for the probe tips, which typically will be engage the probe-compatible connection pads 204, 206 at an angle. Note that in the illustrated embodiment, the probe-compatible connection pads 204 are formed within a castellation hole of the tile 200, while the probe-compatible connection pads 206 are formed on the top surface of the tile 200; either configuration is a matter of design choice (a castellation would be formed from a through-hole via at the edge of the tile 200 that is cut in half vertically when the tiles are singulated).

The ability to test probe an entire tile 200 of dies 202 at microwave frequencies, particular from about 8 GHz and above, using automated test equipment, is a significant benefit of the invention. Such ability is even more important as frequency increases, particularly from about 12 GHz and above, due to increasing influences of parasitic elements on circuit performance. Just as importantly, the entire process adds little to the automated flow of chip fabrication, testing, and packaging.

Further, when mounted on a thin-film tile 200, each die 202 is in essentially its final electrical configuration, with proper grounding and all parasitic influencing electrical connections established (further packaging, as described below, generally will not add significant additional parasitic influences). Accordingly, test probing more accurately reflects the actual performance of a part being tested, and no confounding socket or fixture is required.

Once test probing is complete, the dies 202 and tile 200 are singulated into die/tile assemblies. Since each die/tile assembly is effectively a unitized "chip" in itself, and presents conventional peripheral and/or bottom side connection pads, there are a number of options available for the final package application of the die/tile assemblies.

FIG. 5A shows a complete die/tile assembly 500 comprising a flip-chipped die 202 and a singulated segment 200′ of the thin-film tile 200. Because each flip-chipped die 202 is already mounted on a singulated segment 200' of the tile 200, a customer does not need to have special equipment for positioning and reflowing a solder bumped die. Accordingly, in some configurations, the die/tile assemblies 500 may be provided directly to a customer configured as conventional (i.e., non flip-chip) "dies" suitable for wire-bonding to a circuit board. For example, for users who are replacing an existing III-V semiconductor (e.g., GaAs) die in a chip-and-wire hybrid assembly, it would be possible to mount a die/thin-film assembly 500 using conductive epoxy and achieve a good microwave ground to the back side of the tile segment 200' of the assembly. The signal ports on the die 202 may then be connected using bond wires from the probe-compatible connection pads 204, 206 to the customer's existing circuit board.

In embodiments in which the probe-compatible connection pads 204, 206 are coupled by impedance controlled line to pads accessible on the bottom of the die/tile assemblies, the die/tile assemblies 500 may be soldered directly to a circuit board using conventional surface mounting technology. Thus, one side of the die/tile assembly is test probed, while the other side (the bottom of the tile) may be used for signal input and output as well as ground connections.

For either of the above usages, the die/tile assemblies 500 may be shipped in a tape-and-reel configuration for use in conventional pick-and-place equipment.

FIG. 5B shows a complete die/tile assembly embedded within an over-molded plastic package 502, formed in conventional fashion to encapsulate and seal the die 202. In this configuration, the over-molded package 502 may change the performance characteristics of the die 202, but any change should be a systematic offset across all product units.

FIG. 5C shows a complete die/tile assembly encapsulated within a hermetically sealed package. Typically, a ring 504 (generally made of Covar) encircles the die 202 and is sealed to the thin-film tile segment 200', then covered with a lid 506. A hermetically sealed package of the type illustrated should not change the performance characteristics of the die 202.

Another aspect of the invention includes a method for fabricating and testing a microwave integrated circuit, including:
- flip-chip assembling a plurality of integrated circuit dies on a thin-film tile provisioned with probe-compatible connection pads;
- automatically testing at least some of the plurality of dies through the probe-compatible connection pads; and
- singulating at least some of the plurality of the dies and corresponding segments of the tile into die/tile assemblies.

Another aspect of the invention includes a method for fabricating and testing a microwave integrated circuit, including:
- fabricating a radio frequency circuit as an integrated circuit on a substrate;
- forming solder bumps on the circuit surface of the integrated circuit;
- flip-chip assembling a plurality of solder-bumped integrated circuit dies on a thin-film tile provisioned with probe-compatible connection pads and a plurality of vias coupling selected portions of such dies to a ground plane;
- automatically testing at least some of the plurality of dies by means of a probe applied to the probe-compatible connection pads; and
- singulating at least some of the plurality of the dies and corresponding segments of the tile into die/tile assemblies.

The above methods further include various combinations of additional or modifying steps:
- configuring at least some of the probe-compatible connection pads as ground-signal-ground sets of pads;
- utilizing a thin-film tile having a thickness of less than or equal to about 0.35 mm, or about 0.23 mm, or about 0.175 mm;
- wherein the thin-film tile is made of one of alumina or a low temperature co-fired ceramic;
- wherein the substrate is one of a silicon or silicon-on-insulator substrate;
- wherein the die/tile assemblies are configured for wire-bonding to a circuit board;
- wherein the die/tile assemblies are configured to be soldered directly to a circuit board, including by using surface mounting methodologies;
- wherein the die/tile assemblies are configured to be embedded within an over-molded plastic package;
- wherein the die/tile assemblies are configured to be encapsulated within a hermetically sealed package;
- wherein at least some of the plurality of integrated circuit dies are tested at frequencies at or above about 8 GHz;
- wherein at least some of the plurality of integrated circuit dies are tested at frequencies at or above about 12 GHz;
- disposing the probe-compatible connection pads on the side of the thin-film tile on which the plurality of integrated circuit dies are mounted;
- disposing the probe-compatible connection pads on the side of the thin-film tile opposite from the side on which the plurality of integrated circuit dies are mounted;
- disposing the probe-compatible connection pads on the side of the tile on which the plurality of integrated circuit dies are mounted, and making signal connections to the plurality of integrated circuit dies from the side of the tile opposite from the side of the tile on which the plurality of integrated circuit dies are mounted;
- forming a ground plane on the side of the tile on which the plurality of integrated circuit dies are flip-chip assembled, and electrically coupling the ground plane to selected circuit elements of the plurality of integrated circuit dies by means of solder bumps;
- forming a ground plane on the side of the tile opposite from the side on which the plurality of integrated circuit dies are flip-chip assembled, and electrically coupling the ground plane to selected circuit elements of the plurality of integrated circuit dies by means of through-hole vias within the tile and solder bumps in electrical contact with the through-hole vias;
- forming a first ground plane on the side of the tile on which the plurality of integrated circuit dies are flip-chip assembled and electrically coupling the first ground plane to selected circuit elements of the plurality of integrated circuit dies by means of solder bumps, and forming a second ground plane formed on the side of the tile opposite from the side on which the plurality of integrated circuit dies are flip-chip assembled and electrically coupling the second ground plane to the first ground plane by through-hole vias within the tile.

While the above embodiments are particularly useful when using silicon-based substrates (e.g., Si, SOT, SOS, etc.), the inventive concepts are applicable to other semiconductor substrates, including (but not limited to) the III-V group of semiconductors (e.g., GaAs).

A number of embodiments of the invention have been described. It is to be understood that various modifications may be made without departing from the spirit and scope of the invention. For example, some of the steps described above may be order independent, and thus can be performed in an order different from that described. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A method for fabricating and testing a microwave integrated circuit, including:
   (a) flip-chip assembling a plurality of integrated circuit dies on a thin-film tile provisioned with probe-compatible connection pads such that the probe-compatible connection pads are accessible after assembly for connection to probes;
   (b) automatically testing at least some of the plurality of dies through the probe-compatible connection pads; and
   (c) singulating at least some of the plurality of the dies and corresponding segments of the tile into die/tile assemblies.

2. The method of claim 1, further including configuring at least some of the probe-compatible connection pads as ground-signal-ground sets of pads.

3. The method of claim 1, wherein the thin-film tile has a thickness of less than or equal to about 0.35 mm.

4. The method of claim 1, wherein the thin-film tile has a thickness of less than or equal to about 0.23 mm.

5. The method of claim 1, wherein the thin-film tile has a thickness of less than or equal to about 0.175 mm.

6. The method of claim 1, wherein the thin-film tile is made of one of alumina or a low temperature co-fired ceramic.

7. The method of claim 1, further including fabricating the integrated circuit dies on a silicon-based substrate.

8. The method of claim 7, wherein the silicon-based substrate is one of a silicon or silicon-on-insulator substrate.

9. The method of claim 1, wherein the die/tile assemblies are configured for wire-bonding to a circuit board.

10. The method of claim 1, wherein the die/tile assemblies are configured to be soldered directly to a circuit board.

11. The method of claim 1, wherein the die/tile assemblies are configured to be soldered directly to a circuit board using surface mounting methodologies.

12. The method of claim 1, wherein the die/tile assemblies are configured to be embedded within an over-molded plastic package.

13. The method of claim 1, wherein the die/tile assemblies are configured to be encapsulated within a hermetically sealed package.

14. The method of claim 1, wherein at least some of the plurality of integrated circuit dies are tested at frequencies at or above about 8 GHz.

15. The method of claim 1, wherein at least some of the plurality of integrated circuit dies are tested at frequencies at or above about 12 GHz.

16. The method of claim 1, further including disposing the probe-compatible connection pads on the side of the thin-film tile on which the plurality of integrated circuit dies is flip-chip assembled.

17. The method of claim 1, further including disposing the probe-compatible connection pads on the side of the thin-film tile opposite from the side on which the plurality of integrated circuit dies is flip-chip assembled.

18. The method of claim 1, further including disposing the probe-compatible connection pads on the side of the tile on which the plurality of integrated circuit dies is flip-chip assembled, and making signal connections to the plurality of integrated circuit dies from the side of the tile opposite from the side of the tile on which the plurality of integrated circuit dies is flip-chip assembled.

19. The method of claim 1, further including forming a ground plane on the side of the tile on which the plurality of integrated circuit dies is flip-chip assembled, and electrically coupling the ground plane to selected circuit elements of the plurality of integrated circuit dies by means of solder bumps.

20. The method of claim 1, further including forming a ground plane on the side of the tile opposite from the side on which the plurality of integrated circuit dies is flip-chip assembled, and electrically coupling the ground plane to selected circuit elements of the plurality of integrated circuit dies by means of through-hole vias within the tile and solder bumps in electrical contact with the through-hole vias.

21. The method of claim 1, further including:
   (a) forming a first ground plane on the side of the tile on which the plurality of integrated circuit dies is flip-chip assembled and electrically coupling the first ground plane to selected circuit elements of the plurality of integrated circuit dies by means of solder bumps; and
   (b) forming a second ground plane on the side of the tile opposite from the side on which the plurality of integrated circuit dies is flip-chip assembled and electrically coupling the second ground plane to the first ground plane by through-hole vias within the tile.

22. A method for fabricating and testing a microwave integrated circuit:
   (a) embodying a radio frequency circuit in a plurality of an integrated circuit dies on a silicon-based substrate;
   (b) forming solder bumps on a plurality of integrated circuit dies;
   (c) singulating the plurality of solder-bumped integrated circuit dies;
   (d) flip-chip assembling a plurality of singulated solder-bumped integrated circuit dies on a thin-film tile provisioned with probe-compatible connection pads and a plurality of vias within the tile, such that the probe-compatible connection pads are accessible after assembly for connection to probes;
   (e) automatically testing at least some of the plurality of integrated circuit dies by means of a probe applied to the probe-compatible connection pads; and
   (f) singulating at least some of the plurality of the integrated circuit dies and corresponding segments of the tile into die/tile assemblies.

23. The method of claim 22, further including configuring at least some of the probe-compatible connection pads as ground-signal-ground sets of pads.

24. The method of claim 22, wherein the thin-film tile has a thickness of less than or equal to about 0.35 mm.

25. The method of claim 22, wherein the thin-film tile has a thickness of less than or equal to about 0.23 mm.

26. The method of claim 22, wherein the thin-film tile has a thickness of less than or equal to about 0.175 mm.

27. The method of claim 22, wherein the thin-film tile is made of one of alumina or a low temperature co-fired ceramic.

28. The method of claim 22, wherein the silicon-based substrate is one of a silicon or silicon-on-insulator substrate.

29. The method of claim 22, wherein the die/tile assemblies are configured for wire-bonding to a circuit board.

30. The method of claim 22, wherein the die/tile assemblies are configured to be soldered directly to a circuit board.

31. The method of claim 22, wherein the die/tile assemblies are configured to be soldered directly to a circuit board using surface mounting methodologies.

32. The method of claim 22, wherein the die/tile assemblies are configured to be embedded within an over-molded plastic package.

33. The method of claim 22, wherein the die/tile assemblies are configured to be encapsulated within a hermetically sealed package.

34. The method of claim 22, wherein at least some of the plurality of integrated circuit dies are tested at frequencies at or above about 8 GHz.

35. The method of claim 22, wherein at least some of the plurality of integrated circuit dies are tested at frequencies at or above about 12 GHz.

36. The method of claim 22, further including disposing the probe-compatible connection pads on the side of the thin-film tile on which the plurality of integrated circuit dies is flip-chip assembled.

37. The method of claim 22, further including disposing the probe-compatible connection pads on the side of the thin-film tile opposite from the side on which the plurality of integrated circuit dies is flip-chip assembled.

38. The method of claim 22, further including disposing the probe-compatible connection pads on the side of the tile on which the plurality of integrated circuit dies is flip-chip assembled, and making signal connections to the plurality of integrated circuit dies from the side of the tile opposite from the side of the tile on which the plurality of integrated circuit dies is flip-chip assembled.

39. The method of claim 22, further including forming a ground plane on the side of the tile on which the plurality of integrated circuit dies is flip-chip assembled, and electrically coupling the ground plane to selected circuit elements of the plurality of integrated circuit dies by means of corresponding ones of the solder bumps.

40. The method of claim 22, further including forming a ground plane on the side of the tile opposite from the side on which the plurality of integrated circuit dies is flip-chip assembled, and electrically coupling the ground plane to selected circuit elements of the plurality of integrated circuit dies by means of the vias within the tile and solder bumps in electrical contact with the vias.

41. The method of claim 22, further including:
(a) forming a first ground plane on the side of the tile on which the plurality of integrated circuit dies is flip-chip assembled and electrically coupling the first ground plane to selected circuit elements of the plurality of integrated circuit dies by means of corresponding ones of the solder bumps; and
(b) forming a second ground plane on the side of the tile opposite from the side on which the plurality of integrated circuit dies is flip-chip assembled and electrically coupling the second ground plane to the first ground plane by the vias within the tile.

* * * * *